(12) United States Patent
Lin

(10) Patent No.: US 11,005,467 B1
(45) Date of Patent: May 11, 2021

(54) LOW-NOISE DUTY CYCLE CORRECTION CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/876,165

(22) Filed: May 18, 2020

(51) Int. Cl.
  H03K 5/156    (2006.01)
  H03K 3/017    (2006.01)

(52) U.S. Cl.
  CPC ........... *H03K 5/1565* (2013.01); *H03K 3/017* (2013.01)

(58) Field of Classification Search
  CPC .......... H03K 5/165; H03K 5/159; H03K 5/04; H03K 5/133; H03K 5/135; H03K 2005/00058; H03K 2005/0021; H03K 2005/00215; H03K 2005/00084; H03K 2005/00136; H03K 3/17; H03L 7/0814
  See application file for complete search history.

(56) References Cited

U.S. PATENT DOCUMENTS

| | | | | |
|---|---|---|---|---|
| 6,192,092 B1* | 2/2001 | Dizon | ................ | G06F 1/10 375/371 |
| 6,573,777 B2* | 6/2003 | Saint-Laurent | ...... | H03H 11/265 327/270 |
| 6,897,696 B2* | 5/2005 | Chang | ................ | H03K 5/1506 327/175 |
| 7,304,521 B2* | 12/2007 | Carley | ................ | H03H 11/265 327/264 |
| 7,616,038 B2* | 11/2009 | Oh | ................ | H03K 5/1565 327/172 |
| 7,750,713 B2* | 7/2010 | Oh | ................ | G06F 1/04 327/291 |
| 7,843,214 B2* | 11/2010 | Tatsumi | ............ | H01L 27/11898 326/37 |
| 7,913,199 B2 | 3/2011 | Boerstler et al. | | |
| 7,994,835 B2* | 8/2011 | Chae | ................ | H03K 5/1565 327/175 |
| 8,933,738 B2* | 1/2015 | Wu | ................ | H03K 5/06 327/175 |
| 9,805,773 B1* | 10/2017 | Shi | ................ | G11C 7/1072 |
| 2007/0170969 A1* | 7/2007 | Sommer | ................ | H03K 5/156 327/291 |
| 2020/0213077 A1* | 7/2020 | Shi | ................ | H04L 7/0025 |

* cited by examiner

*Primary Examiner* — Thomas J. Hiltunen

(74) *Attorney, Agent, or Firm* — McClure, Qualey & Rodack, LLP

(57) ABSTRACT

A method operates by receiving a first voltage, which is a logical signal; converting the first voltage into a second voltage using a first inverting buffer with a first pull-up resistance and a first pull-down resistance; and converting the second voltage into a third voltage using a second inverting buffer with a second pull-up resistance and a second pull-down resistance, wherein: the first pull-up resistance, the first pull-down resistance, the second pull-up resistance, the second pull-down resistance are all tunable, and a difference between the first pull-up resistance and the first pull-down resistance is approximately equal to a difference between the second pull-down resistance and the second pull-up resistance.

19 Claims, 5 Drawing Sheets

US 11,005,467 B1

LOW-NOISE DUTY CYCLE CORRECTION CIRCUIT AND METHOD THEREOF

BACKGROUND OF THE DISCLOSURE

Field of the Disclosure

The present disclosure generally relates to duty cycle correction and more particularly to circuits and methods for duty cycle correction that effectively reduce flicker and power supply noise.

Description of Related Art

Many modern electronic circuits require a precise clock for proper operation. A clock is a voltage signal that periodically toggles back and forth between a low level and a high level. A percentage of time that the voltage signal stays in the high level is called a duty cycle. Many circuits require a specific duty cycle for a clock to provide an optimal performance. For instance, in a multi-phase clock system wherein both a rising edge and a falling edge of a clock is used, a 50% duty cycle is usually desired. However, an actual duty cycle of a clock may deviate from the desired value. A duty cycle correction circuit is often used to make a clock have approximately a desired duty cycle.

As depicted in FIG. 1A, a prior art duty cycle correction circuit relies on using an inverter 100, which comprises a PMOS (p-channel metal oxide semiconductor) transistor 111 and a NMOS (n-channel metal oxide semiconductor) transistor 112, as a clock buffer configured receive an input clock and output an output clock. Throughout this disclosure, "$V_{DD}$" denotes a power supply node, and "$V_{SS}$" denotes a ground node. A high-to-low transition of the input clock leads to a low-to-high transition of the output clock with a delay depending on a strength of a pull-up provided by the PMOS transistor 111, while a low-to-high transition of the input clock leads to a high-to-low transition of the output clock with a delay depending on a strength of a pull-down provided by the NMOS transistor 112. When the strength of the pull-up and the strength of the pull-down are equal, there is no difference in the delay of the respective transition, and the duty cycle of the output clock is approximately a complement of the duty cycle of the input clock. For instance, if the duty cycle of the input clock is 45%, the duty cycle of the output clock will be 55%. When the strength of the pull-up is greater (smaller) than the strength of the pull-down, the output clock makes a low-to-high transition faster (slower) than a high-to-low transition, causing the output clock to stay in the high level longer (shorter) and thus have a larger (smaller) duty cycle. Adjusting a relative strength between the pull-up and the pull-down of the inverter thus can adjust a duty cycle of the output clock. A strength of a MOS transistor depends on a width to length ratio of said MOS transistor; a higher width-to-length ratio of the PMOS transistor 111 (NMOS transistor 112) allows a strength of a pull-up (pull-down) provided by the PMOS transistor 111 (NMOS transistor 112) to be greater (smaller). By making a width of the PMOS transistor 111 (NMOS transistor 112) adjustable, one can adjust a strength of the pull-up (pull-down) and thus adjust a duty cycle of the output clock.

A drawback of using inverter 110 as a clock buffer and adjusting a width of a MOS transistor therein to adjust a duty cycle is that the MOS transistor is a major noise contributor. In particular, the MOS transistor contributes a low-frequency noise known as "flicker noise" that is detrimental in many applications. In addition, inverter 110 is sensitive to a noise in either the power supply node $V_{DD}$ or the ground node $V_{SS}$; any noise at the power supply node $V_{DD}$ or the ground node $V_{SS}$ can modulate a duty cycle of the output clock.

In U.S. Pat. No. 7,913,199, Boerstler et al discloses a duty cycle correction circuit that relies on using a PMOS (NMOS) transistor in series with a resistor to determine a strength of a pull-up (pull-down), and adjust a duty cycle of the output clock by adjusting a resistance of the resistor. As depicted in FIG. 1B, a duty cycle correction circuit 120 comprises a PMOS transistor 121, a NMOS transistor 122, a first resistor 123, and a second resistor 124. PMOS transistor 121 along with the first resistor 123 jointly determine a strength of a pull-up of the output clock, while NMOS transistor 122 and the second resistor 124 jointly determine a strength of a pull-down of the output clock. A duty cycle of the output clock can be adjusted by adjusting a resistance of either the first resistor 123 or the second resistor 124 and thus adjusting a relative strength of the pull-up with respect to the pull-down. However, the main objective of Boerstler et al is to reduce a PVT (process, voltage, temperature) variation, while the effect of noise is not considered. Therefore, Boerstler et al teaches to choose a resistance value of the first (second) resistor 123 (124) to be less than approximately a tenth of a resistance value of the PMOS transistor 121 (NMOS transistor 122); in doing so, a noise generated by PMOS transistor 121 (NMOS transistor 122) is greater than a noise generated by the first (second) resistor 123 (124) and an issue of a flicker noise generated by the PMOS transistor 121 or the NMOS transistor 122 is not addressed. In addition, a noise at the power supply node $V_{DD}$ or the ground node $V_{SS}$ that can modulate a duty cycle of the output clock is not considered.

What is desired is a duty cycle correction circuit that can effectively alleviate a flicker noise and a noise in the power supply or ground.

BRIEF DESCRIPTION OF THIS DISCLOSURE

In an embodiment, a circuit is disclosed, the circuit comprising: a first inverting buffer configured to receive a first voltage from a first node and output a second voltage to a second node and a second inverting buffer configured to receive the second voltage from the second node and output a third voltage to a third node, wherein: the first inverting buffer comprises a first P-type tunable resistor controlled by a first digital word, a first PMOS (p-channel metal oxide semiconductor) transistor configured to inject a first pull-up current to the second node through the first P-type tunable resistor upon a high-to-low transition of the first voltage, a first N-type tunable resistor controlled by a second digital word, and a first NMOS (n-channel metal oxide semiconductor) transistor configured to draw a first pull-down current from the second node through the first N-type tunable resistor upon a low-to-high transition of the first voltage; and the second inverting buffer comprises a second P-type tunable resistor controlled by a third digital word that is complementary to the second digital word, a second PMOS transistor configured to inject a second pull-up current to the third node through the second P-type tunable resistor upon a high-to-low transition of the second voltage, a second N-type tunable resistor controlled by a fourth digital word that is complementary to the first digital word, and a second NMOS transistor configured to draw a second pull-down current from the third node through the second N-type tunable resistor upon a low-to-high transition of the second voltage.

In an embodiment, a circuit is disclosed, the circuit comprising a first inverting buffer configured to convert a first voltage, which is a logical signal, at a first node into a second voltage at a second node, and a second inverting buffer configured to convert the second voltage at the second node into a third voltage at a third node, wherein: the first inverting buffer comprises a first pull-up circuit with a first pull-up resistance configured to pull up the second voltage upon a high-to-low transition of the first voltage, and a first pull-down circuit with a first pull-down resistance configured to pull down the second voltage upon a low-to-high transition of the first voltage; the second inverting buffer comprises a second pull-up circuit with a second pull-up resistance configured to pull up the third voltage upon a high-to-low transition of the second voltage, and a second pull-down circuit with a second pull-down resistance configured to pull down the third voltage upon a low-to-high transition of the second voltage; and a difference between the first pull-up resistance and the first pull-down resistance is approximately equal to a difference between the second pull-down resistance and the second pull-up resistance.

In an embodiment, a method is disclosed, the method comprising: receiving a first voltage, which is a logical signal; converting the first voltage into a second voltage using a first inverting buffer with a first pull-up resistance and a first pull-down resistance; and converting the second voltage into a third voltage using a second inverting buffer with a second pull-up resistance and a second pull-down resistance, wherein: the first pull-up resistance, the first pull-down resistance, the second pull-up resistance, the second pull-down resistance are all tunable, and a difference between the first pull-up resistance and the first pull-down resistance is approximately equal to a difference between the second pull-down resistance and the second pull-up resistance.

In an embodiment, a method is disclosed, the method comprising: receiving a first voltage from a first node, wherein the first voltage is a logical signal periodically toggling back and forth between a low level and a high level; upon a high-to-low transition of the first voltage, pulling up a second voltage at a second node by injecting a first pull-up current to the second node using a first PMOS transistor via a first P-type tunable resistor controlled by a first digital word; upon a low-to-high transition of the first voltage, pulling down the second voltage by drawing a first pull-down current from the second node using a first NMOS transistor via a first N-type tunable resistor controlled by a second digital word; upon a high-to-low transition of the second voltage, pulling up a third voltage at a third node by injecting a second pull-up current to the third node using a second PMOS transistor via a second P-type tunable resistor controlled by a third digital word that is complementary to the second digital word; and upon a low-to-high transition of the second voltage, pulling down the third voltage by drawing a second pull-down current from the third node using a second NMOS transistor via a second N-type tunable resistor controlled by a fourth digital word that is complementary to the first digital word.

DETAILED DESCRIPTION OF THIS DISCLOSURE

Figure 1A:
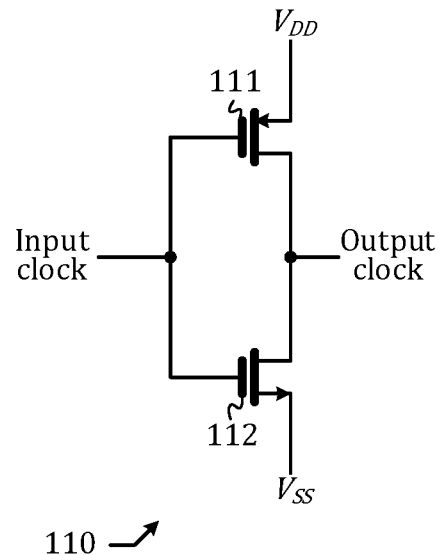
FIG. 1A shows a schematic diagram of an inverter.
Figure 1B:
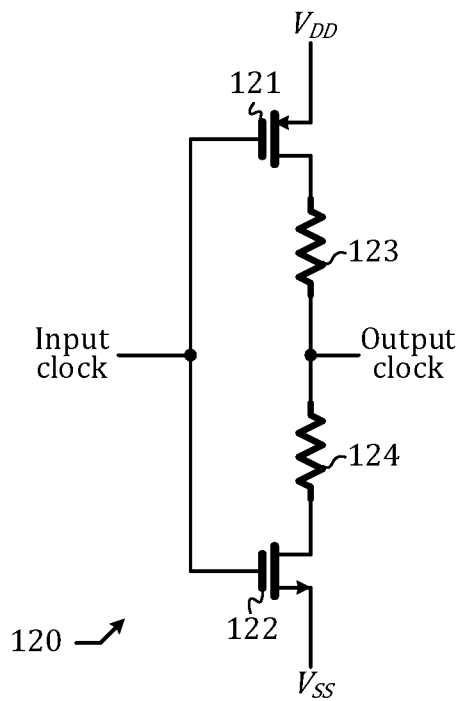
FIG. 1B shows a schematic diagram of a prior art duty cycle correction circuit.

The present disclosure is directed to duty cycle correction. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "power supply," "ground," "CMOS (complementary metal oxide semiconductor)," "NMOS (n-channel metal oxide semiconductor)," "PMOS (p-channel metal oxide semiconductor)," "resistor," "resistance," and "switch." Terms like these are used in a context of microelectronics, and the associated concepts are apparent to those of ordinary skill in the art and thus will not be explained in detail here.

Those of ordinary skill in the art can recognize a resistor symbol and can recognize a MOS (metal-oxide semiconductor) transistor symbol, for both PMOS transistor and NMOS transistor, and identify the "source," the "gate," and the "drain" terminals thereof. Those of ordinary skills in the art can read schematics of a circuit comprising resistors, NMOS transistors, and PMOS transistors, and do not need a verbose description about how one transistor or resistor connects with another in the schematics. Those of ordinary skills in the art understand units such as V (Volt), micron (μm), nanometer (nm), and Ohm.

This present disclosure is disclosed in terms of an engineering sense. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

Throughout this disclosure, "$V_{DD}$" denotes a power supply node, and "$V_{SS}$" denotes a ground node. Note that a ground node is a node at which a voltage level is substantially zero, and a power supply node is a node at which a voltage level is substantially stationary and higher than zero. In this disclosure, depending on a context that is apparent to those of ordinary skill in the art, sometimes $V_{DD}$ refers to the voltage level at the power supply node $V_{DD}$, while $V_{SS}$ sometimes refers to the voltage level at the power supply node $V_{SS}$. For instance, it is apparent that expressions like "$V_{DD}$ is 1.05V" mean that the voltage level at the power supply node $V_{DD}$ is 1.05V.

In this present disclosure, a signal is a voltage of a variable level that can vary with time. A (voltage) level of a signal at a moment represents a state of the signal at that moment.

A logical signal is a signal of two states: a low state and a high state. The low state is also referred to as a "0" state, while the high stage is also referred to as a "1" state. Regarding a logical signal Q, expressions like "Q is high" or "Q is low," mean is "Q is in the high state" or "Q is in the low state." Likewise, expression like "Q is 1" or "Q is 0," mean is "Q is in the 1 state" or "Q is in the 0 state."

When a logical signal toggles from low to high, it undergoes a low-to-high transition. When a logical signal toggles from high to low, it undergoes a high-to-low transition.

When a MOS transistor is used to embody a switch, it is controlled by a control signal that is a logical signal applied at a gate of the MOS transistor. A switch embodied by a NMOS transistor is in an "on" state when the control signal is high, and in an "off" state when the control signal is low. A switch embodied by a PMOS transistor is in an "on" state when the control signal is low, and in an "off" state when the control signal is high. A MOS transistor has a resistance called "on-resistance" when it is in the "on" state, and a resistance called "off-resistance" when it is in the "off" state. An off-resistance of a MOS transistor is substantially greater than an on-resistance of the MOS transistor.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A circuit is a collection of a transistor, a resistor, and/or other electronic devices inter-connected in a certain manner to embody a certain function.

An inverting buffer is a circuit configured to receive a first logical signal and output a second logical signal that is a logical inversion of the first logical signal. An inverting buffer comprises a pull-up circuit and a pull-down circuit. A high-to-low transition of the first logical signal activates the pull-up circuit to pull up the second logical signal to a voltage level of a power supply node, resulting in a low-to-high transition of the second logical signal. A low-to-high transition of the first logical signal activates the pull-down circuit to pull down the second logical signal to a voltage level of a ground node, resulting in a high-to-low transition of the second logical signal. A resistance of the pull-up circuit is referred to as a pull-up resistance. A resistance of the pull-down circuit is referred to as a pull-down resistance. A time that the second logical signal takes to complete a low-to-high transition depends on the pull-up resistance, while a time that the second logical signal takes to complete a high-to-low transition depends on the pull-down resistance.

Figure 2:
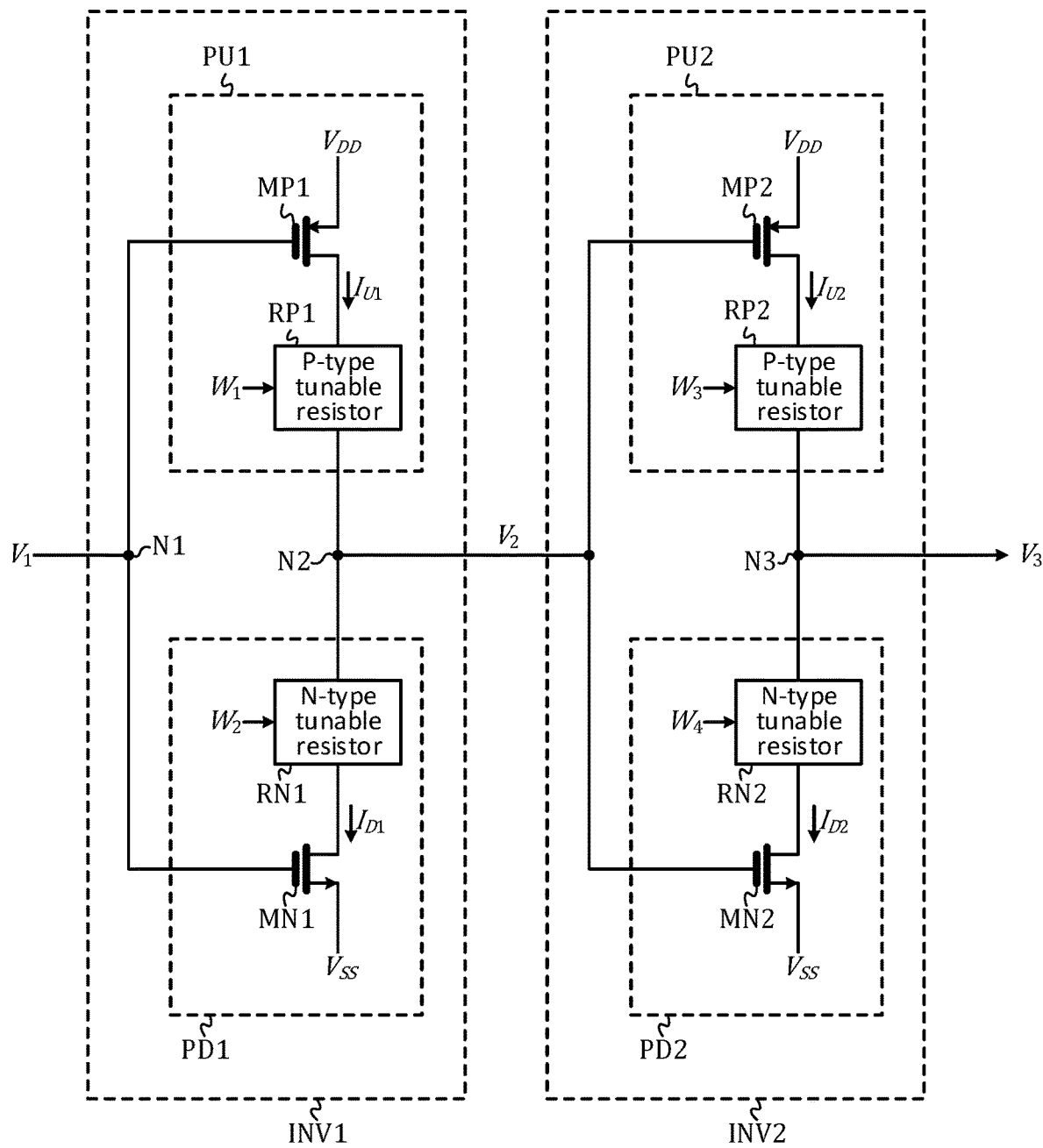
FIG. 2 shows a schematic diagram of a duty cycle correction circuit in accordance with an embodiment of the present disclosure.

A schematic diagram of a duty cycle correction circuit 200 in accordance with an embodiment of the present disclosure is depicted in FIG. 2. Duty cycle correction circuit 200 comprises: a first inverting buffer INV1 configured to receive a first voltage $V_1$ from a first node N1 and output a second voltage $V_2$ to a second node N2; and a second inverting buffer INV2 configured to receive the second voltage $V_2$ at the second node N2 and output a third voltage $V_3$ at a third node N3. The first inverting buffer INV1 comprises a first pull-up circuit PU1 and a first pull-down circuit PD1. The second inverting buffer INV2 comprises a second pull-up circuit PU2 and a second pull-down circuit PD2. The first pull-up circuit PU1 comprises a first P-type tunable resistor RP1 controlled by a first digital word $W_1$ and a first PMOS (p-channel metal oxide semiconductor) transistor MP1 configured to inject a first pull-up current $I_{U1}$ to the second node N2 through the first P-type tunable resistor RP1 in accordance with the first voltage $V_1$. The first pull-down circuit PD1 comprises a first N-type tunable resistor RN1 controlled by a second digital word $W_2$, and a first NMOS (n-channel metal oxide semiconductor) transistor MN1 configured to draw a first pull-down current $I_{D1}$ from the second node N2 through the first N-type tunable resistor RN1 in accordance with the first voltage $V_1$. The second pull-up circuit PU2 comprises a second P-type tunable resistor RP2 controlled by a third digital word $W_3$, and a second PMOS transistor MP2 configured to inject a second pull-up current $V_2$ to the third node N3 through the second P-type tunable resistor RP2 in accordance with the second voltage $V_2$. The second pull-down circuit PD2 comprises a second N-type tunable resistor RN2 controlled by a fourth digital word $W_4$, and a second NMOS transistor MN2 configured to draw a second pull-down current $I_{D2}$ from the third node N3 through the second N-type tunable resistor RN2 in accordance with the second voltage $V_2$.

A resistance of the first (second) P-type tunable resistor RP1 (RP2) is adjustable and determined by a value of $W_1$ ($W_3$). A resistance of the first (second) N-type tunable resistor RN1 (RN2) is adjustable and determined by a value of $W_2$ ($W_4$). In an embodiment, an increment of $W_1$ ($W_3$) leads to a larger resistance of the first (second) P-type tunable resistor RP1 (RP2), while an increment of $W_2$ ($W_4$) leads to a smaller resistance of the first (second) N-type tunable resistor RN1 (RN2).

The first voltage $V_1$ is a clock that periodically toggles back and forth between a low level and a high level. In an embodiment, the low level is $V_{SS}$, while the high level is $V_{DD}$; as explained earlier, this means: the low level is a voltage level of the ground node $V_{SS}$, while the high level is a voltage level of the power supply node $V_{DD}$. When $V_1$ toggles from low (high) to high (low), it undergoes a low-to-high (high-to-low) transition.

Hereafter, sometimes the definite terms "the first," "the second," "the third," and "the fourth," are omitted for brevity, but the omission will not result in any confusion. For instance, "the first PMOS transistor MP1" is sometimes simply referred to as "PMOS transistor MP1" and the omission of "the first" results in no confusion, since there is no other "PMOS transistor MP1" than "the first PMOS transistor MP1" in these specifications.

Upon a low-to-high transition of $V_1$, PMOS transistor MP1 is turned off, while NMOS transistor MN1 is turned on to draw current $I_{D1}$ from node N2 via N-type tunable resistor RN1, thus pulling down $V_2$ and forcing a high-to-low transition of $V_2$ from $V_{DD}$ to $V_{SS}$. A speed of the high-to-low transition of $V_2$ depends on a pull-down resistance of the pull-down circuit PD1, i.e. a total resistance of NMOS transistor MN1 in series with N-type tunable resistor RN1; a smaller pull-down resistance leads to a faster high-to-low transition of $V_2$. Upon a high-to-low transition of $V_1$, NMOS transistor MN1 is turned off, while PMOS transistor MP1 is turned on to inject current $I_{U1}$ to node N2 via P-type tunable resistor RP1, thus pulling up $V_2$ and forcing a low-to-high transition of $V_2$ from $V_{SS}$ to $V_{DD}$. A speed of the low-to-high transition of $V_2$ depends on a pull-up resistance of the first pull-up circuit PU1, i.e. a total resistance of PMOS transistor MP1 in series with P-type tunable resistor RP1; a smaller pull-up resistance leads to a faster low-to-high transition of $V_2$. When the pull-up resistance is smaller (greater) than the pull-down resistance, $V_2$ will complete a low-to-high transition faster (slower) than a high-to-low transition, causing $V_2$ to stay at high longer (shorter) and thus have a larger (smaller) duty cycle. A duty cycle of $V_2$ thus can be adjusted by adjusting a difference between the pull-up resistance and the pull-down resistance by changing a resistance of P-type tunable resistor RP1 through changing $W_1$, or changing a resistance of N-type tunable resistor RN1 through changing $W_2$, or changing both.

The second inverting buffer INV2 is identical to the first inverting buffer INV1, as far as circuit topology and function are concerned, and thus not explained in detail here. Whatever descriptions regarding the first inverting buffer INV1 apply to the second inverting buffer INV2 by simply replacing $V_1$, $V_2$, $W_1$, $W_2$, MN1, RN1, MP1, RP1, $I_{U1}$, $I_{D1}$, and N2 with $V_2$, $V_3$, $W_3$, $W_4$, MN2, RN2, MP2, RP2, $I_{U2}$, $I_{D2}$, and N3, respectively.

Figure 3:
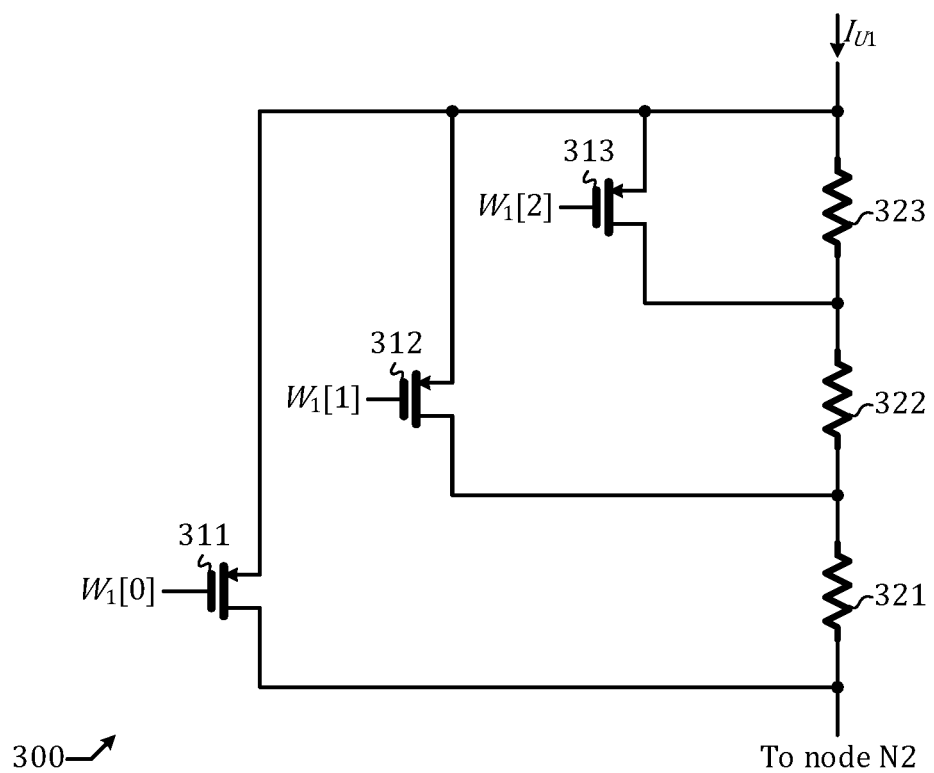
FIG. 3 shows a schematic diagram of a P-type tunable resistor in accordance with an embodiment of the present disclosure.

A schematic diagram of a P-type tunable resistor 300 that can be used to embody the first P-type tunable resistor RP1 in accordance with an embodiment of this present disclosure is depicted in FIG. 3. By way of example but not limitation, $W_1$ has four possible values 0, 1, 2, and 3, and encoded into three logical signals $W_1[0]$, $W_1[1]$, and $W_1[2]$. P-type tunable resistor 300 comprises three PMOS transistors 311, 312, and 313, and three resistors 321, 322, and 323. The three resistors 321, 322, and 323 are connected in series and configured to provide a conduction path for the current $I_{U1}$ to flow to node N2. The three PMOS transistors 311, 312, and 313 embody three switches that are controlled by $W_1[0]$, $W_1[1]$, and $W_1[2]$, respectively, and configured to conditionally short a part of the conduction path. Let $R_{321}$, $R_{322}$, and $R_{323}$ denote a resistance of resistors 321, 322, and 323, respectively. PMOS transistors 311, 312, and 313 all have an on-resistance that is substantially smaller than any of $R_{321}$, $R_{322}$, and $R_{323}$, and an off-resistance that is substantially greater than any of $R_{321}$, $R_{322}$, and $R_{323}$. In an embodiment, $W_1$ is encoded in accordance with the following table:

| $W_1$ | 0 | 1 | 2 | 3 |
|---|---|---|---|---|
| $W_1[0]$ | 0 | 1 | 1 | 1 |
| $W_1[1]$ | 0 | 0 | 1 | 1 |
| $W_1[2]$ | 0 | 0 | 0 | 1 |
| Total resistance | 0 | $R_{321}$ | $R_{321} + R_{322}$ | $R_{321} + R_{322} + R_{323}$ |

When $W_1$ is 0, $W_1[0]$ is low and PMOS transistor 311 is turned on to short the entire conduction path and cause a resistance of the conduction path to be approximately zero. When $W_1$ is 1, $W_1[0]$ is high, $W_1[1]$ is low, PMOS transistor 311 is turned off, but PMOS transistor 312 is turned on to short the part of the conduction path that contains resistors 322 and 323 and cause the resistance of the conduction path to be $R_{321}$. When $W_1$ is 2, $W_1[0]$ and $W_1[1]$ are high, $W_1[2]$ is low, PMOS transistors 311 and 312 are turned off, but PMOS transistor 313 is turned on to short the part of the conduction path that contains resistor 323 and cause the resistance of the conduction path to be $R_{321}+R_{322}$. When $W_1$ is 3, $W_1[0]$, $W_1[1]$, and $W_1[2]$ are all high, PMOS transistors 311, 312, and 313 are all turned off, and the resistance of the conduction path is $R_{321}+R_{322}+R_{323}$. This way, P-type tunable resistor 300 can provide a programmable resistance in accordance with a value of $W_1$, and an increment of the value of $W_1$ leads to an increment of the programmable resistance.

P-type tunable resistor 300 can also be used to embody P-type tunable resistor RP2 of FIG. 2 by replacing $W_1$, $I_{U1}$, and node N2 in FIG. 3 with $W_3$, $I_{U2}$, and node N3, respectively.

Figure 4:
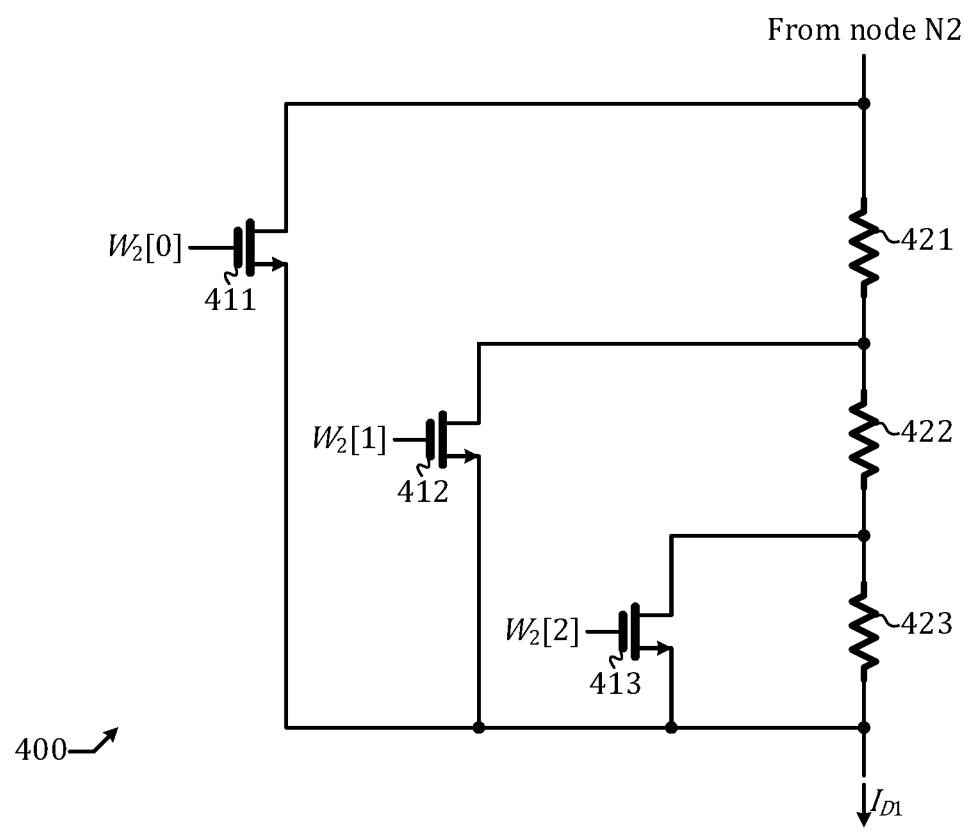
FIG. 4 shows a schematic diagram of a N-type tunable resistor in accordance with an embodiment of the present disclosure.

A schematic diagram of a N-type tunable resistor 400 that can be used to embody N-type tunable resistor RN1 in accordance with an embodiment of this present disclosure is depicted in FIG. 4. By way of example but not limitation, $W_2$ has four possible values 0, 1, 2, and 3, and encoded into three logical signals $W_2[0]$, $W_2[1]$, and $W_2[2]$. N-type tunable resistor 400 comprises three NMOS transistors 411, 412, and 413, and three resistors 421, 422, and 423. The three resistors 421, 422, and 423 are connected in series and configured to provide a conduction path for the current $I_{D1}$ to flow from node N2. The three NMOS transistors 411, 412, and 413 embody three switches that are controlled by $W_2[0]$, $W_2[1]$, and $W_2[2]$, respectively, and configured to conditionally short a part of the conduction path. Let $R_{421}$, $R_{422}$, and $R_{423}$ denote a resistance of resistors 421, 422, and 423, respectively. NMOS transistors 411, 412, and 413 all have an on-resistance that is substantially smaller than any of $R_{421}$, $R_{422}$, and $R_{423}$, and an off-resistance that is substantially greater than any of $R_{421}$, $R_{422}$, and $R_{423}$. In an embodiment, $W_2$ is encoded in accordance with the following table:

| $W_2$ | 0 | 1 | 2 | 3 |
|---|---|---|---|---|
| $W_2[0]$ | 0 | 0 | 0 | 1 |
| $W_2[1]$ | 0 | 0 | 1 | 1 |
| $W_1[2]$ | 0 | 1 | 1 | 1 |
| Total resistance | $R_{421} + R_{422} + R_{423}$ | $R_{421} + R_{422}$ | $R_{421}$ | 0 |

When $W_2$ is 0, $W_2[0]$, $W_2[1]$, and $W_2[2]$ are all low and NMOS transistors 411, 412, and 413 are all turned off, and a resistance of the conduction path is $R_{421}+R_{422}+R_{423}$. When $W_2$ is 1, $W_2[2]$ is high, $W_2[0]$ and $W_2[1]$ are low, NMOS transistors 411 and 412 are turned off, but NMOS transistor 413 is turned on to short the part of the conduction path that contains resistor 423 and cause the resistance of the conduction path to be approximately $R_{421}+R_{422}$. When $W_2$ is 2, $W_2[1]$ and $W_2[2]$ are high, $W_2[0]$ is low, NMOS transistor 411 is turned off, but transistor 412 is turned on to short the part of the conduction path that contains resistor 422 and 423 and cause the resistance of the conduction path to be $R_{421}$. When $W_2$ is 3, $W_2[0]$, $W_2[1]$, and $W_2[2]$ are all high, NMOS transistor 411 is turned on to short the entire conduction path, and the resistance of the conduction path is approximately zero. This way, N-type tunable resistor 400 can provide a programmable resistance in accordance with a value of $W_2$, and an increment of the value of $W_2$ leads to a decrement of the programmable resistance.

N-type tunable resistor 400 can also be used to embody N-type tunable resistor RN2 of FIG. 2 by replacing $W_2$, $I_{D1}$, and node N2 in FIG. 4 with $W_4$, $I_{D2}$, and node N3, respectively.

In an embodiment, $R_{421}$ is equal to $R_{321}$, $R_{422}$ is equal to $R_{322}$, and $R_{423}$ is equal to $R_{323}$.

A MOS transistor will generate a low-frequency noise known as "flicker noise" that can modulate a resistance of the MOS transistor. Both PMOS transistors MP1 and NMOS transistors MN1 will generate a flicker noise that can modulate their respective on-resistance and thus modulate a duty cycle and create a jitter in $V_2$. Likewise, both PMOS transistors MP2 and NMOS transistors MN2 will generate a flicker noise that can modulate their respective on-resistance and thus modulate a duty cycle and create a jitter in $V_3$. To alleviate an effect of a flicker noise, in an embodiment, an on-resistance of PMOS transistor MP1 is substantially smaller than a resistance of the P-type tunable resistor RP1 (except for the extreme case where the entire conduction path in RP1 is shorted and a resistance of RP1 is set to a minimum value); an on-resistance of PMOS transistor MP2 is substantially smaller than a resistance of the P-type tunable resistor RP2 (except for the extreme case where the entire conduction path in RP2 is shorted and a resistance of RP2 is set to a minimum value); an on-resistance of NMOS transistor MN1 is substantially smaller than a resistance of the N-type tunable resistor RN1 (except for the extreme case where the entire conduction path in RN1 is shorted and a resistance of RN1 is set to a minimum value); an on-resistance of NMOS transistor MN2 is substantially smaller than a resistance of the N-type tunable resistor RN2 (except for the extreme case where the entire conduction path in RN2 is shorted and a resistance of RN2 is set to a minimum value). This way, a modulation on an on-resistance of any MOS transistor in FIG. 2 due to a flicker noise can be negligible, because the on-resistance of said MOS transistor is substantially smaller than a tunable resistor in series with said MOS transistor.

In an embodiment, a first variable of a first quantity is said to be substantially smaller than a second variable of a second quantity if the first quantity is no more than 10% of the second quantity. In another embodiment, a first variable of a first quantity is said to be substantially smaller than a second variable of a second quantity if the first quantity is no more than 20% of the second quantity.

The first inverting buffer INV1 and the second inverting buffer INV2 are cascaded, resulting in overall a non-inverting buffer, wherein a low-to-high transition of $V_1$ leads to a low-to-high transition of $V_3$, and a high-to-low transition of $V_1$ leads to a high-to-low transition of $V_3$. In an embodiment, an amount of duty cycle correction provided by the duty cycle correction circuit 200 is approximately evenly distributed between the first inverting buffer INV1 and the second inverting buffer INV2. For instance, if a duty cycle of $V_1$ is 44% and we desire a duty cycle of $V_3$ to be 50%, we need the duty cycle correction circuit 200 to provide an amount of 6% duty cycle correction, then each of the first inverting buffer INV1 and the second inverting buffer INV2 is configured to provide an amount of 3% duty cycle correction; in this case, a duty cycle of $V_2$ is 53% (note that the duty cycle of $V_2$ will otherwise be 56% if the first inverting buffer INV1 provides no duty cycle correction).

The following arrangements are made to ensure the duty cycle correction provided by the duty cycle correction circuit 200 can be approximately evenly distributed between the first inverting buffer INV1 and the second inverting buffer INV2. First, PMOS transistors MP1, PMOS transistor MP2, NMOS transistor MN1, and NMOS transistor MN2 have approximately the same on-resistance. This way, there is no difference in an effect of a transistor on any transition of either $V_2$ or $V_3$. Second, a resistance of P-type tunable resistor RP1 is approximately equal to a resistance of N-type tunable resistor RN2, while a resistance of N-type tunable resistor RN1 is approximately equal to a resistance of P-type tunable resistor RP2. This way, a difference between the pull-up resistance of the first pull-up circuit PU1 and the pull-down resistance of the first pull-down circuit PD1 is approximately equal to a difference between the pull-down resistance of the second pull-down circuit PD2 and the pull-up resistance of the second pull-up circuit PU2. Therefore, the first inverting buffer INV1 and the second inverting buffer INV2 can provide approximately an equal amount of duty cycle correction, albeit in opposite polarity due to the logical inversion of the first inverting buffer INV1. When P-type tunable resistor 300 of FIG. 3 is used to embody P-type tunable resistors RP1 and RP2 and N-type tunable resistor 400 of FIG. 4 is used to embody N-type tunable resistors RN1 and RN2, the second arrangement is fulfilled when $R_{421}$ is equal to $R_{321}$, $R_{422}$ is equal to $R_{322}$, $R_{423}$ is equal to $R_{323}$, $W_4$ is complementary to $W_1$ (i.e. $W_4[0]$, $W_4[1]$, and $W_4[2]$ are logical inversions of $W_1[0]$, $W_1[1]$, and $W_1[2]$, respectively), and $W_3$ is complementary to $W_2$ (i.e. $W_3[0]$, $W_3[1]$, and $W_3[2]$ are logical inversions of $W_2[0]$, $W_2[1]$, and $W_2[2]$, respectively).

Using a cascade of two inverting buffers to form a duty cycle correction circuit to perform a duty cycle correction and evenly distributing a needed amount of duty cycle correction between the two inverting buffers (instead of solely relying on one inverting buffer to achieve the needed amount duty cycle correction) offer two advantages. First, due to using two inverting buffers, for each inverting buffer, a time duration wherein a flicker noise can affect a transition can be reduced by half. An energy of a flicker noise increases quadratically with time, therefore, an energy of a flicker noise in each inverting buffer is reduced to one fourth. The total flicker noise energy is a sum of the flicker noise energies in the two inverting buffers. Therefore, the total flicker noise energy of the entire duty cycle correction circuit is reduced by half. Second, a power supply noise at $V_{DD}$ or a ground noise at $V_{SS}$ also can cause impairment. An effect of a low-frequency noise at $V_{DD}$ or $V_{SS}$ is similar to an effect of a flicker noise of a MOS transistor. Therefore, by the same token, a total noise energy resulting from a low-frequency noise in $V_{DD}$ or $V_{SS}$ is also reduced by half by using two inverting buffers and evenly distributing an amount of correction between the two inverting buffers.

By way of example but not limitation, in an embodiment: the duty cycle correction circuit 200 is an integrated circuit fabricated on a silicon substrate using a 28 nm CMOS process; $V_{DD}$ is 1.05V; $V_{SS}$ is 0V; width/length are 60 μm/200 nm for NMOS transistors MN1 and MN2; width/length are 84 μm/200 nm for PMOS transistors MP1 and MP2; $R_{321}$, $R_{322}$, $R_{323}$, $R_{421}$, $R_{422}$, $R_{423}$ are all 130-Ohm; width/length are 120 μm/30 nm for NMOS transistors 411, 412, and 413; width/length are 156 μm/30 nm for PMOS transistors 311, 312, and 313.

In an embodiment, a plurality of the duty cycle correction circuits is cascaded to extend a range of duty cycle correction. In this embodiment, the digital words for each duty cycle correction circuit in said plurality of duty cycle correction circuits can be independently set.

Figure 5:
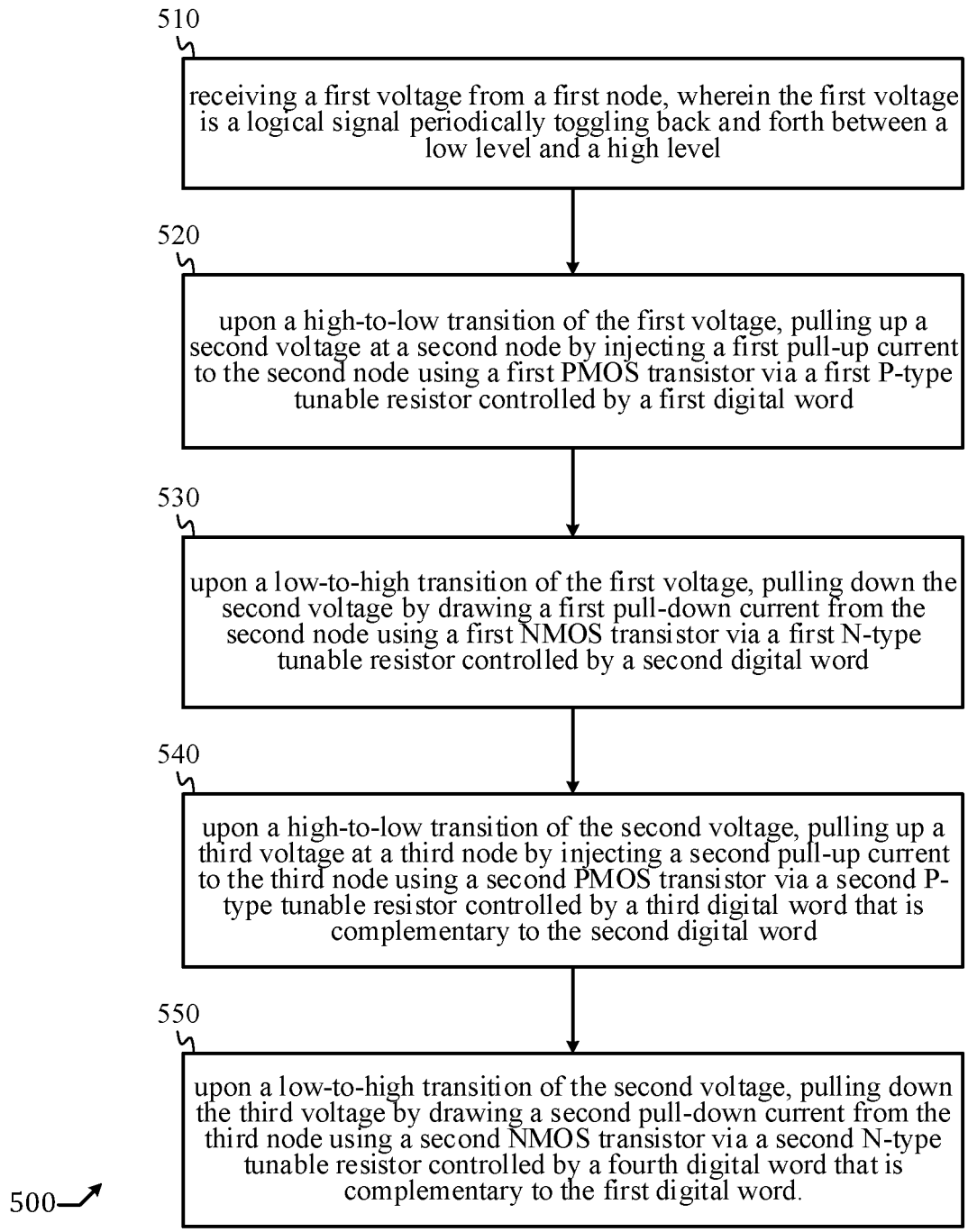
FIG. 5 shows a flow diagram of a method in accordance with an embodiment of the present disclosure.

As shown in a flow diagram 500 depicted in FIG. 5, a method in accordance with an embodiment of the present disclosure comprises: (step 510) receiving a first voltage from a first node, wherein the first voltage is a logical signal periodically toggling back and forth between a low level and a high level; (step 520) upon a high-to-low transition of the first voltage, pulling up a second voltage at a second node by injecting a first pull-up current to the second node using a first PMOS transistor via a first P-type tunable resistor controlled by a first digital word; (step 530) upon a low-to-high transition of the first voltage, pulling down the second voltage by drawing a first pull-down current from the second node using a first NMOS transistor via a first N-type tunable resistor controlled by a second digital word; (step 540) upon a high-to-low transition of the second voltage, pulling up a third voltage at a third node by injecting a second pull-up current to the third node using a second PMOS transistor via a second P-type tunable resistor controlled by a third digital word that is complementary to the second digital word; and (step 550) upon a low-to-high transition of the second voltage, pulling down the third voltage by drawing a second pull-down current from the third node using a second NMOS transistor via a second N-type tunable resistor controlled by a fourth digital word that is complementary to the first digital word.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A circuit comprising a first inverting buffer configured to receive a first voltage from a first node and output a second voltage to a second node, and a second inverting buffer configured to receive the second voltage from the second node and output a third voltage to a third node, wherein:
   the first inverting buffer comprises a first P-type tunable resistor controlled by a first digital word, a first PMOS (p-channel metal oxide semiconductor) transistor configured to inject a first pull-up current to the second node through the first P-type tunable resistor upon a high-to-low transition of the first voltage, a first N-type tunable resistor controlled by a second digital word, and a first NMOS (n-channel metal oxide semiconductor) transistor configured to draw a first pull-down current from the second node through the first N-type tunable resistor upon a low-to-high transition of the first voltage; and
   the second inverting buffer comprises a second P-type tunable resistor controlled by a third digital word that is complementary to the second digital word, a second PMOS transistor configured to inject a second pull-up current to the third node through the second P-type tunable resistor upon a high-to-low transition of the second voltage, a second N-type tunable resistor controlled by a fourth digital word that is complementary to the first digital word, and a second NMOS transistor configured to draw a second pull-down current from the third node through the second N-type tunable resistor upon a low-to-high transition of the second voltage.

2. The circuit of claim 1, wherein:
   the first P-type tunable resistor comprises a serial connection of a plurality of resistors configured to form a conduction path and a plurality of PMOS transistors controlled by a plurality of logical signals, respectively, configured to conditionally short a part of the conduction path;
   said plurality of logical signals are encoded from the first digital word; and an increment of the first digital word leads to less part of the conduction path being shorted and thus a larger resistance of the conduction path.

3. The circuit of claim 1, wherein:
   the second P-type tunable resistor comprises a serial connection of a plurality of resistors configured to form a conduction path and a plurality of PMOS transistors controlled by a plurality of logical signals, respectively, configured to conditionally short a part of the conduction path;
   said plurality of logical signals are encoded from the third digital word; and an increment of the third digital word leads to less part of the conduction path being shorted and thus a larger resistance of the conduction path.

4. The circuit of claim 1, wherein:
   the first N-type tunable resistor comprises a serial connection of a plurality of resistors configured to form a conduction path and a plurality of NMOS transistors controlled by a plurality of logical signals, respectively, configured to conditionally short a part of the conduction path;
   said plurality of logical signals are encoded from the second digital word; and an increment of the second digital word leads to more part of the conduction path being shorted and thus a smaller resistance of the conduction path.

5. The circuit of claim 1, wherein:
   the second N-type tunable resistor comprises a serial connection of a plurality of resistors configured to form a conduction path and a plurality of NMOS transistors controlled by a plurality of logical signals, respectively, configured to conditionally short a part of the conduction path;
   said plurality of logical signals are encoded from the fourth digital word; and an increment of the fourth digital word leads to more part of the conduction path being shorted and thus a smaller resistance of the conduction path.

6. The circuit of claim 1, wherein:
   an on-resistance of the first PMOS transistor is substantially smaller than a resistance of the first P-type tunable resistor unless the resistance of the first P-type tunable resistor is set to a minimum value;
   an on-resistance of the second PMOS transistor is substantially smaller than a resistance of the second P-type tunable resistor unless the resistance of the second P-type tunable resistor is set to a minimum value;
   an on-resistance of the first NMOS transistor is substantially smaller than a resistance of the first N-type tunable resistor unless the resistance of the first N-type tunable resistor is set to a minimum value; and
   an on-resistance of the second NMOS transistor is substantially smaller than a resistance of the second N-type tunable resistor unless the resistance of the second N-type tunable resistor is set to a minimum value.

7. The circuit of claim 1, wherein:
   the first PMOS transistor, the second PMOS transistor, the first NMOS transistor, and the second NMOS transistor all have approximately the same on-resistance, the first P-type tunable resistor and the second N-type tunable resistor are of approximately the same resistance, and the first N-type tunable resistor and the second P-type tunable resistor are of approximately the same resistance.

8. A circuit comprising a first inverting buffer configured to convert a first voltage, which is a logical signal, at a first node into a second voltage at a second node, and a second inverting buffer configured to convert the second voltage at the second node into a third voltage at a third node, wherein:
   the first inverting buffer comprises a first pull-up circuit with a first pull-up resistance configured to pull up the second voltage upon a high-to-low transition of the first voltage, and a first pull-down circuit with a first pull-down resistance configured to pull down the second voltage upon a low-to-high transition of the first voltage;

the second inverting buffer comprises a second pull-up circuit with a second pull-up resistance configured to pull up the third voltage upon a high-to-low transition of the second voltage, and a second pull-down circuit with a second pull-down resistance configured to pull down the third voltage upon a low-to-high transition of the second voltage; and a difference between the first pull-up resistance and the first pull-down resistance is approximately equal to a difference between the second pull-down resistance and the second pull-up resistance, wherein the first pull-up circuit comprises a first PMOS (p-channel metal oxide semiconductor) transistor in series with a first P-type tunable resistor controlled by a first digital word; the first pull-down circuit comprises a first NMOS (n-channel metal oxide semiconductor) transistor in series with a first N-type tunable resistor controlled by a second digital word; the second pull-up circuit comprises a second PMOS transistor in series with a second P-type tunable resistor controlled by a third digital word that is complementary to the second digital word; the second pull-down circuit comprises a second NMOS transistor in series with a second N-type tunable resistor controlled by a fourth digital word that is complementary to the first digital word.

9. The circuit of claim 8, wherein the first P-type tunable resistor comprises a serial connection of a plurality of resistors configured to form a conduction path and a plurality of PMOS transistors controlled by a plurality of logical signals, respectively, configured to conditionally short a part of the conduction path; said plurality of logical signals are encoded from the first digital word; and an increment of the first digital word leads to less part of the conduction path being shorted and thus a larger resistance of the conduction path.

10. The circuit of claim 8, wherein the second P-type tunable resistor comprises a serial connection of a plurality of resistors configured to form a conduction path and a plurality of PMOS transistors controlled by a plurality of logical signals, respectively, configured to conditionally short a part of the conduction path; said plurality of logical signals are encoded from the third digital word; and an increment of the third digital word leads to less part of the conduction path being shorted and thus a larger resistance of the conduction path.

11. The circuit of claim 8, wherein the first N-type tunable resistor comprises a serial connection of a plurality of resistors configured to form a conduction path and a plurality of NMOS transistors controlled by a plurality of logical signals, respectively, configured to conditionally short a part of the conduction path; said plurality of logical signals are encoded from the second digital word; and an increment of the second digital word leads to more part of the conduction path being shorted and thus a smaller resistance of the conduction path.

12. The circuit of claim 8, wherein the second N-type tunable resistor comprises:

a serial connection of a plurality of resistors configured to form a conduction path and a plurality of NMOS transistors controlled by a plurality of logical signals, respectively, configured to conditionally short a part of the conduction path; said plurality of logical signals are encoded from the fourth digital word; and an increment of the fourth digital word leads to more part of the conduction path being shorted and thus a smaller resistance of the conduction path.

13. The circuit of claim 8, wherein:

an on-resistance of the first PMOS transistor is substantially smaller than a resistance of the first P-type tunable resistor unless the resistance of the first P-type tunable resistor is set to a minimum value;

an on-resistance of the second PMOS transistor is substantially smaller than a resistance of the second P-type tunable resistor unless the resistance of the second P-type tunable resistor is set to a minimum value;

an on-resistance of the first NMOS transistor is substantially smaller than a resistance of the first N-type tunable resistor unless the resistance of the first N-type tunable resistor is set to a minimum value; and an on-resistance of the second NMOS transistor is substantially smaller than a resistance of the second N-type tunable resistor unless the resistance of the second N-type tunable resistor is set to a minimum value.

14. A method comprising: receiving a first voltage from a first node, wherein the first voltage is a logical signal periodically toggling back and forth between a low level and a high level;

upon a high-to-low transition of the first voltage, pulling up a second voltage at a second node by injecting a first pull-up current to the second node using a first PMOS (p-channel metal oxide semiconductor) transistor via a first P-type tunable resistor controlled by a first digital word;

upon a low-to-high transition of the first voltage, pulling down the second voltage by drawing a first pull-down current from the second node using a first NMOS (n-channel metal oxide semiconductor) transistor via a first N-type tunable resistor controlled by a second digital word;

upon a high-to-low transition of the second voltage, pulling up a third voltage at a third node by injecting a second pull-up current to the third node using a second PMOS transistor via a second P-type tunable resistor controlled by a third digital word that is complementary to the second digital word; and upon a low-to-high transition of the second voltage, pulling down the third voltage by drawing a second pull-down current from the third node using a second NMOS transistor via a second N-type tunable resistor controlled by a fourth digital word that is complementary to the first digital word.

15. The method of claim 14, wherein the first P-type tunable resistor comprises a serial connection of a plurality of resistors configured to form a conduction path and a plurality of PMOS transistors controlled by a plurality of logical signals, respectively, configured to conditionally short a part of the conduction path; said plurality of logical signals are encoded from the first digital word; and an increment of the first digital word leads to less part of the conduction path being shorted and thus a larger resistance of the conduction path.

16. The method of claim 14, wherein the second P-type tunable resistor comprises a serial connection of a plurality of resistors configured to form a conduction path and a plurality of PMOS transistors controlled by a plurality of logical signals, respectively, configured to conditionally short a part of the conduction path; said plurality of logical signals are encoded from the third digital word; and an increment of the third digital word leads to less part of the conduction path being shorted and thus a larger resistance of the conduction path.

17. The method of claim 14, wherein the first N-type tunable resistor comprises a serial connection of a plurality of resistors configured to form a conduction path and a plurality of NMOS transistors controlled by a plurality of logical signals, respectively, configured to conditionally short a part of the conduction path; said plurality of logical signals are encoded from the second digital word; and an increment of the second digital word leads to more part of the conduction path being shorted and thus a smaller resistance of the conduction path.

18. The method of claim 14, wherein the second N-type tunable resistor comprises a serial connection of a plurality of resistors configured to form a conduction path and a plurality of NMOS transistors controlled by a plurality of logical signals, respectively, configured to conditionally short a part of the conduction path; said plurality of logical signals are encoded from the fourth digital word; and an increment of the fourth digital word leads to more part of the conduction path being shorted and thus a smaller resistance of the conduction path.

19. The method of claim 14, wherein an on-resistance of the first PMOS transistor is substantially smaller than a resistance of the first P-type tunable resistor unless the resistance of the first P-type tunable resistor is set to a minimum value; an on-resistance of the second PMOS transistor is substantially smaller than a resistance of the second P-type tunable resistor unless the resistance of the second P-type tunable resistor is set to a minimum value; an on-resistance of the first NMOS transistor is substantially smaller than a resistance of the first N-type tunable resistor unless the resistance of the first N-type tunable resistor is set to a minimum value; and an on-resistance of the second NMOS transistor is substantially smaller than a resistance of the second N-type tunable resistor unless the resistance of the second N-type tunable resistor is set to a minimum value.

* * * * *